US008612789B2

(12) United States Patent
Taylor et al.

(10) Patent No.: US 8,612,789 B2
(45) Date of Patent: Dec. 17, 2013

(54) POWER MANAGEMENT WITHIN AN INTEGRATED CIRCUIT

(75) Inventors: Bradley L. Taylor, Santa Cruz, CA (US); Ting Lu, Austin, TX (US); William E. Allaire, West Chester, PA (US); Hassan K. Bazargan, Saratoga, CA (US); Hy V. Nguyen, San Jose, CA (US); Shashank Bhonge, Bangalore (IN)

(73) Assignee: Xilinx, Inc., San Jose, CA (US)

( * ) Notice: Subject to any disclaimer, the term of this patent is extended or adjusted under 35 U.S.C. 154(b) by 133 days.

(21) Appl. No.: 13/005,994

(22) Filed: Jan. 13, 2011

(65) Prior Publication Data

US 2012/0185719 A1 Jul. 19, 2012

(51) Int. Cl.
*G06F 1/26* (2006.01)

(52) U.S. Cl.
USPC .......................................... 713/324

(58) Field of Classification Search
USPC .......................................... 713/324
See application file for complete search history.

(56) References Cited

U.S. PATENT DOCUMENTS

| | | | |
|---|---|---|---|
| 5,581,482 A | 12/1996 | Wiedenman et al. | |
| 5,835,702 A | 11/1998 | Levine et al. | |
| 5,867,644 A | 2/1999 | Ranson et al. | |
| 6,351,724 B1 | 2/2002 | Klassen et al. | |
| 6,662,302 B1 * | 12/2003 | Garey ........................... | 713/324 |
| 6,785,107 B1 | 8/2004 | Schmitt | |
| 6,803,785 B1 | 10/2004 | May et al. | |
| 6,948,147 B1 | 9/2005 | New et al. | |
| 7,026,840 B1 * | 4/2006 | May et al. ........................ | 326/38 |
| 7,143,218 B1 | 11/2006 | Yin et al. | |
| 7,225,285 B1 | 5/2007 | Fairman et al. | |
| 7,274,212 B1 | 9/2007 | Burney et al. | |
| 7,308,564 B1 | 12/2007 | Jenkins, IV | |
| 7,492,183 B2 * | 2/2009 | Balasubramanian et al. .. | 326/37 |
| 7,512,813 B2 | 3/2009 | Goodnow et al. | |
| 7,673,164 B1 * | 3/2010 | Agarwal ........................ | 713/324 |
| 7,724,028 B1 | 5/2010 | Ansari et al. | |
| 7,853,809 B2 * | 12/2010 | Zhang et al. ................... | 713/300 |
| 7,992,020 B1 * | 8/2011 | Tuan et al. ..................... | 713/320 |
| 8,156,355 B2 * | 4/2012 | Mendel et al. ................. | 713/320 |
| 2003/0062922 A1 | 4/2003 | Douglass et al. | |
| 2003/0163298 A1 | 8/2003 | Odom et al. | |
| 2004/0230771 A1 | 11/2004 | Borgatti et al. | |
| 2004/0236893 A1 | 11/2004 | May et al. | |
| 2007/0079148 A1 | 4/2007 | Pastorello et al. | |
| 2008/0048715 A1 | 2/2008 | Balasubramanian et al. | |
| 2010/0095145 A1 * | 4/2010 | Chan et al. .................... | 713/324 |
| 2010/0194200 A1 | 8/2010 | Kwon et al. | |
| 2012/0033508 A1 | 2/2012 | Adams et al. | |
| 2012/0185719 A1 | 7/2012 | Taylor et al. | |

OTHER PUBLICATIONS

Taylor, Brad and Wittig, Ralph, "28nm Generation Programmable Families", 7 Series FPGAs, Extensible Processing Platform Family, AMBA AX14 IP, Aug. 8, 2010, pp. 1-25, Xilinx, 2100 Logic Drive, San Jose, CA 95124.

(Continued)

*Primary Examiner* — Nimesh G Patel
(74) *Attorney, Agent, or Firm* — Kevin T. Cuenot

(57) ABSTRACT

An integrated circuit can include a processor system configured to execute program code, wherein the processor system is hard-wired. The IC also can include programmable circuitry configurable to implement different physical circuits. The programmable circuitry can be coupled to the processor system and can be configured to implement a power off procedure under the control of the processor system.

17 Claims, 5 Drawing Sheets

(56) References Cited

OTHER PUBLICATIONS

Nass, Rich, "Xilinx puts ARM Core into its FPGAs", EE Times, 2 pp., Apr. 27, 2010, available at http://www.eetimes.com/electronics-products/processors/4115523/Xilinx-puts-ARM-core-into-its-FPGA.

U.S. Appl. No. 12/913,713, Lu, Ting, et al., filed Oct. 27, 2010, Xilinx, Inc., 2100 Logic Drive, San Jose, CA 95124 USA.

U.S. Appl. No. 13/005,941, Taylor, Bradley, L., et al., filed Jan. 13, 2011, Xilinx, Inc., 2100 Logic Drive, San Jose, CA 95124 USA.

U.S. Appl. No. 13/005,962, Taylor, Bradley, L., et al., filed Jan. 13, 2011, Xilinx, Inc., 2100 Logic Drive, San Jose, CA 95124 USA.

U.S. Appl. No. 13/037,234, Allaire, William, E., et al., filed Feb. 28, 2011, Xilinx, Inc., 2100 Logic Drive, San Jose, CA USA.

Leibson, Steve, "Designing Low-Power Systems with FPGAs", Low-PowerDesign, Online Feb. 1, 2010, Retreived from Internet May 3, 2013, http://low-powerdesign.com/sleibson/2010/02/01/designing-low-power-systems-with-fpgas.

Leibson, Steve, "Designing Low-Power Systems with FPGAs, Part 2", Low-PowerDesign, Online Feb. 1, 2010, Retreived from Internet May 3, 2013, http://low-powerdesign.com/sleibson/2010/02/01/designing-low-power-systems-with-fpgas-part_2.

Leibson, Steve, "Xilinx redefines the high-end microcontroller with its ARM-based Extensible Processing Platform—Part 1", Low-PowerDesign, Online May 1, 2010, Retreived from Internet May 3, 2013, http://low-powerdesign.com/sleibson/2010/02/01/xilinx-redefines-the-high-end-microcontroller-with-its-extensible-processing-platform-part-1>.

Leibson, Steve, "Xilinx redefines the high-end microcontroller with its ARM-based Extensible Processing Platform—Part 2", Low-PowerDesign, Online May 1, 2010, Retreived from Internet May 3, 2013, http://low-powerdesign.com/sleibson/2010/05/01/xilinx-redefines-the-high-end-microcontroller-with-its-arm_basedextensible-processing-platform-case_studies-part-2>.

\* cited by examiner

POWER MANAGEMENT WITHIN AN INTEGRATED CIRCUIT

FIELD OF THE INVENTION

One or more embodiments disclosed within this specification relate to integrated circuits (ICs). More particularly, one or more embodiments relate to power management within an IC that includes a processor system and programmable circuitry.

BACKGROUND

Integrated circuits (ICs) can be implemented to perform specified functions. One type of IC is a programmable IC such as, e.g., a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable including, for example, application specific integrated circuits (ASICs). For instance, another type of programmable IC includes a combination of hard-coded transistor logic and a programmable switch fabric that programmably interconnects the hard-coded transistor logic.

Some modern ICs, including some of the varieties of ICs discussed above, include an embedded processor that is capable of executing program code. The processor can be fabricated as part of the same die that includes the programmable logic circuitry and the programmable interconnect circuitry, also referred to collectively as "programmable circuitry" of the IC. It should be appreciated that execution of program code within a processor is distinguishable from "programming" or "configuring" the programmable circuitry that may be available on an IC. The act of programming or configuring programmable circuitry of an IC using configuration data results in the implementation of different physical circuits within the programmable circuitry. Within a complex IC, e.g., one having programmable circuitry and a processor, power management can be a significant issue.

SUMMARY

One or more embodiments disclosed within this specification relate to integrated circuits (ICs) and, more particularly, to power management within an IC that includes a processor system (PS) and programmable circuitry.

An embodiment can include a method of regulating power consumption within an IC that includes a programmable fabric coupled to a PS. The method can include placing the PS and the programmable fabric of the IC in an operational mode and initiating a power off procedure within the programmable circuitry under control of the PS while the PS remains in the operational mode.

Another embodiment can include an IC. The IC can include a PS configured to execute program code, wherein the PS is hard-wired. The IC also can include programmable circuitry that is configurable to implement different physical circuits. The programmable circuitry can be coupled to the PS and can be powered off independently of the PS.

Another embodiment can include an IC that includes a PS configured to execute program code, wherein the PS is hard-wired. The IC further can include programmable circuitry that is configurable to implement different physical circuits. The programmable circuitry can be coupled to the PS and can be configured to implement a power off procedure under the control of the PS. The PS can be configured to select a circuit from a plurality of functionally equivalent circuits according to a performance profile of each of the plurality of functionally equivalent circuits. The PS further can be configured to initiate configuration of the programmable circuitry to implement the selected circuit within the programmable circuitry.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to power management within an IC that includes a processor system and a programmable circuitry portion. An IC can be implemented to include a processor system that is coupled to programmable circuitry. In general, the programmable circuitry can be configured to be powered on and/or off independently of the processor system. The processor system can be tasked with managing power cycling of the programmable circuitry. The ability to power off the programmable circuitry independently of the processor system allows the IC to function in a highly power efficient manner. Further, the processor system can continue to operate and execute program code while the programmable circuitry remains powered off.

With the power management functionality providing for independence between the two subsystems of the IC, i.e., the processor system and the programmable circuitry, the processor system also can be placed into a low power or sleep mode. Upon awakening from the low power mode, the processor system can perform functions such as initiating a power on procedure within the programmable circuitry.

When the processor system and programmable circuitry are operational, the processor system can initiate one or more configuration and/or reconfiguration functions relating to the programmable circuitry. Tasking the processor system with reconfiguration capabilities to physically implement circuitry within the programmable circuitry allows a system implemented within the IC to continue to evolve and be upgraded even when deployed and operating in the field.

Figure 1:
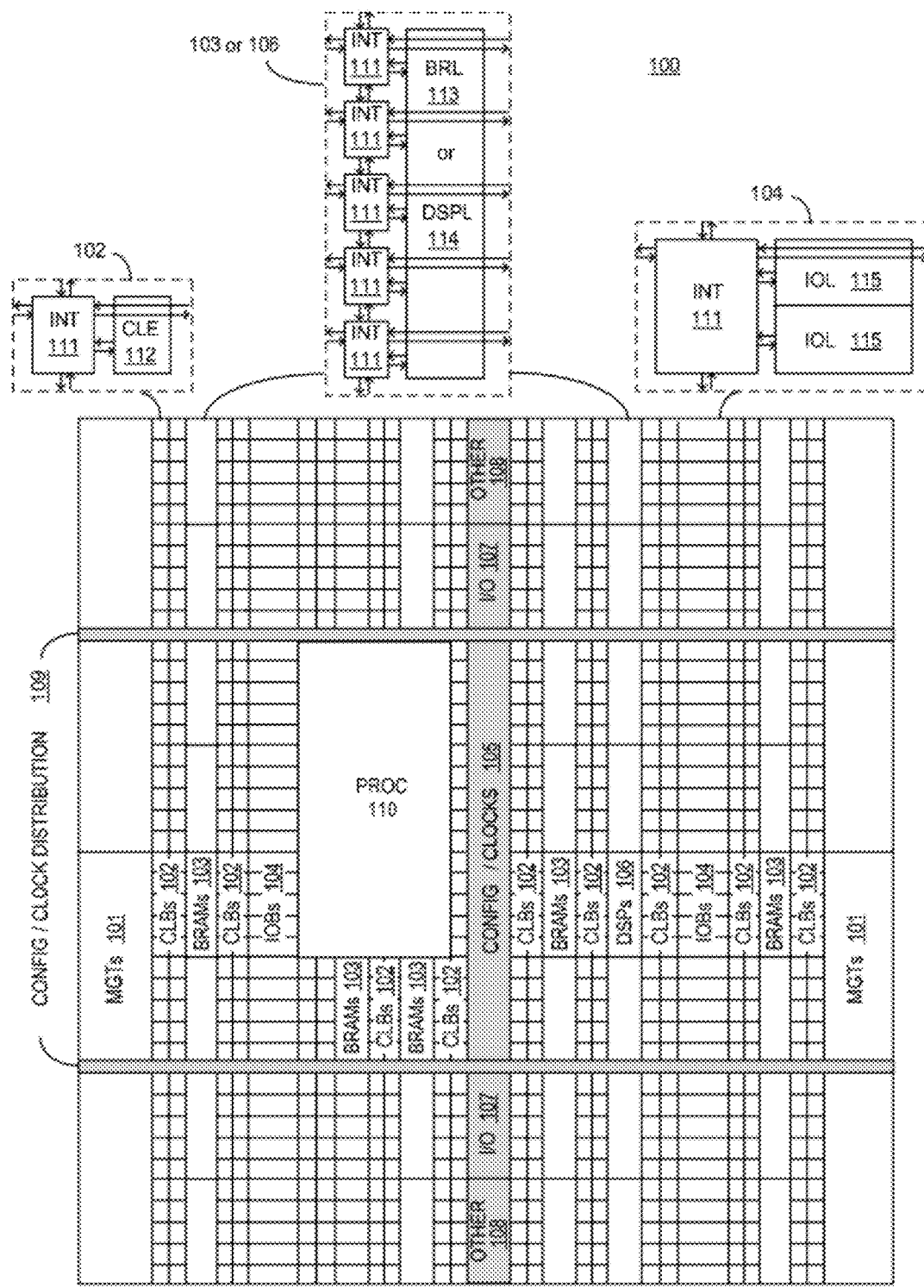
FIG. 1 is a first block diagram illustrating an architecture of an integrated circuit (IC) in accordance with an embodiment disclosed within this specification.

FIG. 1 is a first block diagram illustrating an architecture 100 for an IC in accordance with an embodiment disclosed within this specification. Architecture 100 can be implemented within a field programmable gate array (FPGA) type of IC, for example. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth.

In some programmable ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an input/output logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die (shown shaded in FIG. 1) is used for configuration, clock, and other control logic. Horizontal areas 109 extending from this column are used to distribute the clocks and configuration signals across the breadth of the programmable IC.

Some programmable ICs utilizing the architecture illustrated in FIG. 1 include additional logic blocks that disrupt the regular columnar structure making up a large part of the programmable IC. The additional logic blocks can be programmable blocks and/or dedicated circuitry. For example, a processor block depicted as PROC 110 spans several columns of CLBs and BRAMs.

PROC 110 can be implemented as a hard-wired processor that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 110 can include one or more cores, e.g., central processing units, cache memories, a memory controller, unidirectional and/or bidirectional interfaces configurable to couple directly to I/O pins of the programmable IC and/or couple to the programmable circuitry of the programmable IC. The phrase "programmable circuitry" can refer to the various programmable or configurable circuit blocks or tiles described herein, as well as the interconnect circuitry that selectively couples the various circuit blocks, tiles, and/or elements according to configuration data that is loaded into the IC. In an embodiment, the programmable circuitry also can be implemented as, or called, a programmable fabric. Using one or more interfaces that couple PROC 110 with the programmable circuitry, PROC 110 can perform power management functions for the entire IC. For example, PROC 110 can control power cycling of the programmable circuitry. In addition, PROC 110 can enter and exit a sleep or low power mode.

FIG. 1 is intended to illustrate only an exemplary architecture that can be used to implement an IC. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC.

Figure 2:
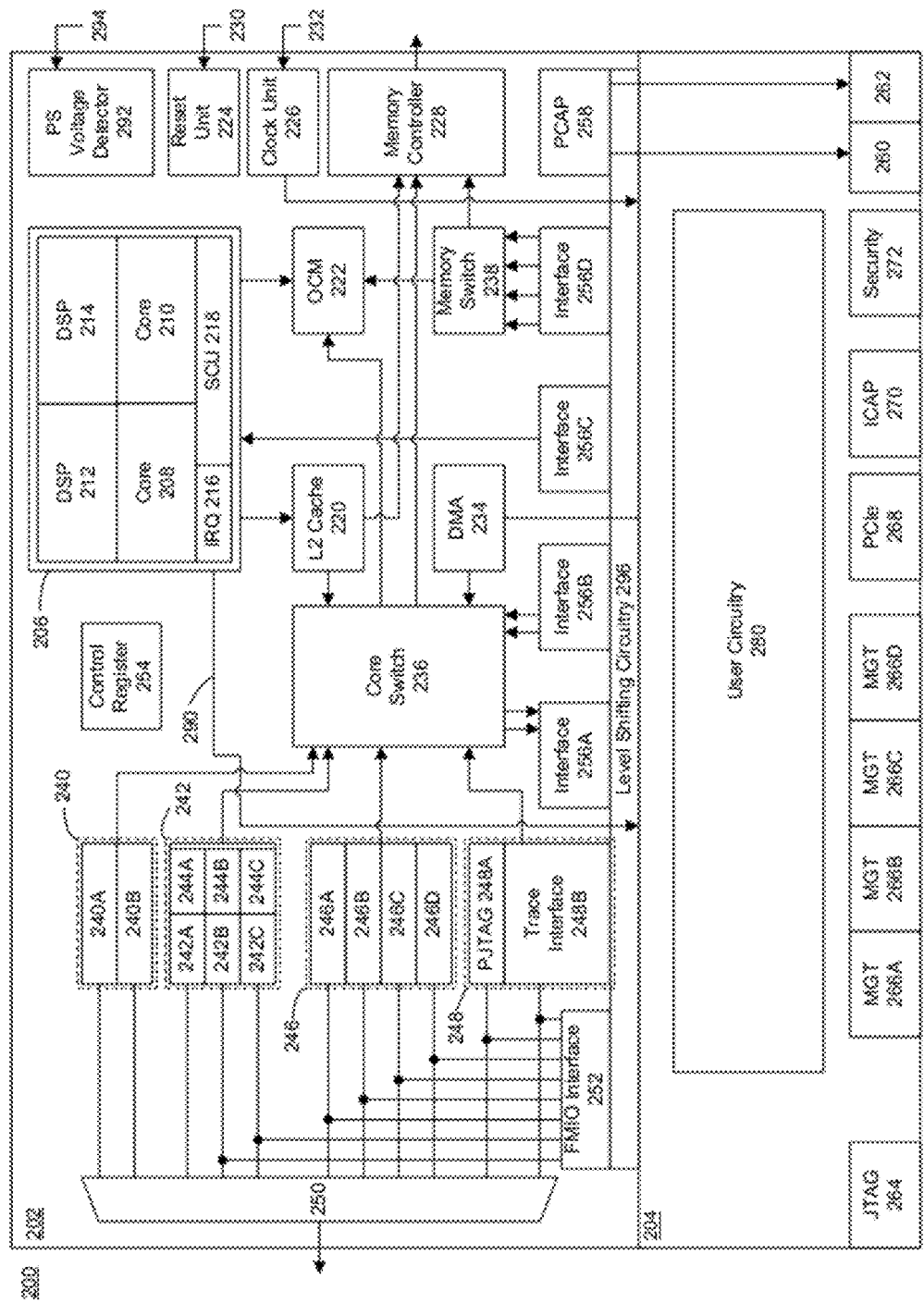
FIG. 2 is a second block diagram illustrating an IC in accordance with another embodiment disclosed within this specification.

FIG. 2 is a second block diagram illustrating an IC 200 configured in accordance with another embodiment disclosed within this specification. IC 200 can be implemented using any of a variety of different architectures that include a processor system (PS) 202 coupled to programmable circuitry 204. For example, IC 200 can be implemented using an architecture that is the same as, or similar to, that of architecture 100 of FIG. 1, though this need not be the case. In general, IC 200 illustrates the various interfaces that can be used to couple PS 202 with circuitry implemented within programmable circuitry 204 in greater detail.

In the example shown in FIG. 2, PS 202 is illustrated as occupying approximately two-thirds of the die of IC 200, while programmable circuitry 204 is shown as occupying approximately one-third of the same die. FIG. 2 is not, however, intended to be a scale representation of IC 200. Rather, FIG. 2 is provided for purposes of illustration and is not intended as a limitation of the one or more embodiments disclosed within this specification.

In general, PS 202 is implemented as a hard-wired system within IC 200. To the extent that various components or modules within PS 202 are coupled by lines, e.g., signal or communication links, that have arrows, such arrows are intended to illustrate the direction or flow of control. In this regard, a signal illustrated as a line with a directional arrow generally indicates that control over the signal is exerted by the source component from which the arrow emanates rather than the target component. The arrows, in general, are not intended to indicate one-way flow of data or directionality of the signal. In this regard, signals can be implemented as bi-directional signals or communication links despite the presence of the directional arrow.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal, as noted, may represent bi-directional communication between two, or more, components connected by that signal or wire as the case may be.

As shown, PS 202 can include a core complex 206. Core complex 206 can include cores 208 and 210, DSP units 212 and 214, an interrupt request unit (IRQ) 216, and a snoop control unit (SCU) 218. Each of cores 208 and 210 can include a level 1 (L1) cache (not shown) embedded therein. While any of a variety of different types of processor cores and/or DSP units can be used, in an embodiment disclosed herein, cores 208 and 210 each can be implemented as an ARM Cortex™-A9 type of processor core with each having a 32 KB instruction cache and a 32 KB data cache. DSP units 212 and 214 can be implemented in the form of NEON™ media and/or floating point processing engines. Each DSP unit 212 and 214 can provide 128-bit vector-based DSP functions. The ARM Cortex™-A9 processor cores and the NEON™ media and/or floating point processing engines are available from ARM Holdings of Cambridge, UK (ARM).

Within PS 202, core complex 206 is coupled to a level 2 (L2) cache 220 and an on-chip memory (OCM) 222. L2 cache 220 can be implemented as a 256 KB memory. OCM 222 also can be implemented as a 256 KB memory. Cores 208 and 210 and DSP units 212 and 214 can directly access L2 cache 220 and OCM 222. In general, OCM 222 provides local memory that is available to PS 202 and/or to programmable circuitry 204, e.g., circuits implemented within programmable circuitry 204. By comparison, L2 cache 220, which is also a memory, functions as a cache for PS 202. Accordingly, L2 cache 220 can store small blocks or portions of data which are effectively copies of data bits stored in RAM, e.g., execution memory off-chip. If, for example, a read request is issued for data stored in L2 cache 220, the data is read from L2 cache 220 as opposed to being retrieved from a RAM.

PS 202 further can include a reset unit 224, a clock unit 226, and a memory controller 228. Reset unit 224 can receive one or more signals originating from a source external to IC 200, e.g., signal 230. Signal 230 can instruct reset unit 224 to reset PS 202 and/or one or more or all of the components within PS 202. Clock unit 226 also can receive one or more reference signals, e.g., signal 232, from a source external to IC 200. Clock unit 226, for example, can be implemented as, or include, phase-lock loop circuitry capable of synchronizing to received signal 232. Clock unit 226 can generate one or more clock signals of one or more different frequencies that can be distributed throughout PS 202 (not shown). Further, clock unit 226 can generate one or more clock signals of one or more different frequencies that can be distributed to programmable circuitry 204 for use by circuits implemented therein.

Memory controller 228 can be implemented to communicate with one or more different types of RAM located external to IC 200, e.g., "off-chip." For example, memory controller 228 can be implemented to access, e.g., read and/or write, various types of memory including, but not limited to, Dual Data Rate (DDR) 2, DDR3, Low Power (LP) DDR2 types of memory, whether 16-bit, 32-bit, 16-bit with ECC, etc. The list of different memory types with which memory controller 228 is able to communicate is provided for purposes of illustration only and is not intended as a limitation or to be exhaustive.

PS 202 also can include a direct memory access (DMA) interface 234 that is coupled to a core switch 236 and to programmable circuitry 204. PS 202 further includes a memory switch 238 that couples to one of interfaces 256, i.e., interface 256D, to be described within this specification in greater detail, OCM 222, and memory controller 228.

Core switch 236 can route signals among various components of PS 202 as shown. In an embodiment, core switch 236 can be coupled directly to an internal bus of PS 202 (not shown). In such an embodiment, each other component within PS 202 that connects with core switch 236 can be coupled to core switch 236 through the internal bus. For example, interfaces 240, 242, 246, and 248 each can couple to core switch 236 via the internal bus. The internal bus can be implemented as any of a variety of different buses such as, for example, an Advanced Peripheral Bus (APB).

In general, PS 202 can include approximately four categories of I/O. PS 202 can provide flash memory type interfaces, higher performance interfaces, lower performance interfaces, and debugging interfaces. Regarding the first category of I/O, PS 202 can include one or more flash memory interfaces 240 illustrated as 240A and 240B. For example, one or more of flash memory interfaces 240 can be implemented as a Quad Serial Peripheral Interface (QSPI) configured for 4-bit communication. One or more of flash memory interfaces 240 can be implemented as a parallel 8-bit NOR/SRAM type of interface. One or more of flash memory interfaces 240 can be implemented as a NAND interface configured for 8-bit and/or or 16-bit communication. Other bit widths, however, can be used.

Regarding the second category of I/O, PS 202 can include one or more interfaces 242 providing a higher level of performance than the first category of I/O. Each of interfaces 242A-242C can be coupled to a DMA controller 244A-244C respectively. For example, one or more of interfaces 242 can be implemented as a universal serial bus (USB) type of interface. One or more of interfaces 242 can be implemented as a gigabit Ethernet type of interface. One or more of interfaces 242 can be implemented as a Secure Digital (SD) type of interface.

Regarding the third category of I/O, PS 202 can include one or more interfaces 246 such as interfaces 246A-246D that provide a lower level of performance than the second category of I/O. For example, one or more of interfaces 246 can be implemented as a General Purpose I/O (GPIO) type of interface. One or more of interfaces 246 can be implemented as a Universal Asynchronous Receiver/Transmitter (UART) type of interface. One or more of interfaces 246 can be implemented in the form of a Serial Peripheral Interface (SPI) bus type of interface. One or more of interfaces 246 can be implemented in the form of a Controller-Area-Network (CAN) type of interface. One or more of interfaces 246 can be implemented in the form of a Triple Timer Counter (TTC) and/or a Watchdog Timer (WDT) type of interface.

Regarding the fourth category of I/O, PS 202 can include one or more debug interfaces 248 such as processor JTAG (PJTAG) port or interface 248A and a trace interface 248B. PJTAG port 248A can provide an external debug interface for PS 202. Trace interface 248B can provide a port to receive debug, e.g., trace, information from programmable circuitry 204, a port to send debugging data of PS 202 out to programmable circuitry 204, and a cross trigger port. The cross trigger port allows circuitry within programmable circuitry 204 to trigger debug functions such as trace within PS 202. Similarly, PS 202 can initiate debug functions within circuits implemented within programmable circuitry 204.

As shown, each of interfaces 240, 242, 246, and 248 can be coupled to a multiplexer 250. Multiplexer 250 provides a plurality of outputs that can be directly routed or coupled to external pins of IC 200, e.g., balls of the package within which IC 200 is disposed. For example, a plurality of I/O pins of IC 200, e.g., 53 pins, can be shared among interfaces 240, 242, 246, and 248. A user can configure multiplexer 250, as part of PS 202, to select which of interfaces 240-248 are to be used and, therefore, coupled to I/O pins of IC 200 via multiplexer 250.

As shown, interfaces 242-248 also can be selectively coupled to a fabric multiplexer input/output (FMIO) interface 252. Accordingly, based upon user configuration of IC 200 and, more particularly, PS 202, any one of I/O categories two, three, or four, i.e., interfaces 242-248, can be coupled to programmable circuitry 204 of IC 200 via FMIO interface 252. This allows data being communicated via any one of interfaces 242-248 to be routed to circuitry within programmable circuitry 204 for further processing and/or monitoring.

Control register 254 can be configured to control various, if not most, aspects of PS 202. One or more commands can be written to control register 254 to control or regulate operation of PS 202. For example, circuits within programmable circuitry 204 can write to control register 254 through an interface such as interface 256B, to be described herein in further detail. Control register 254 can control or regulate functions such as controlling intellectual property (IP) enable resets, setting clock frequencies generated by clock unit 226, specifying I/O drive strength, and other system level functions. Control register 254 can regulate additional functions such as powering down PS 202, powering down or deactivating particular interfaces of PS 202 independently, or the like. Control register 254 can be accessed through a bus such as, for example, an APB (not shown), that couples control register 254 to core switch 236.

PS 202 also can include one or more interfaces 256, depicted as interfaces 256A-256D, that couple directly with programmable circuitry 204. In an embodiment, one or more or all of interfaces 256 can be implemented in accordance with the AMBA AXI Protocol Specification (AXI) as published by ARM. For example, each of interfaces 256 can be implemented in conformance with the AMBA AXI Protocol Specification v. 2.0, which is incorporated herein by reference in its entirety. In general, AXI is a high performance, high frequency interface that is suitable for submicron interconnect.

Referring again to FIG. 2, interfaces 256A and 256B, for example, each can be implemented to provide two, 32-bit channels that couple programmable circuitry 204 with core switch 236. Interface 256A can be implemented as a general-purpose master interface. Interface 256A, for example, can be used to perform general purpose transfers of data from PS 202 and/or a DMA controller therein, to programmable circuitry 204. Interface 256B can be implemented as a general-purpose slave interface. For example, interface 256B can be used to perform general purpose data transfer between PS 202 and programmable circuitry 204.

Through interfaces 256A-256B and core switch 236, circuits implemented within programmable circuitry 204 can access various ones of interfaces 240, 242, 246, and 248. Through interfaces 256A and/or 256B, in combination with core switch 236, circuits within programmable circuitry 204 further can access OCM 222 directly and off-chip memory through memory controller 228, etc. In an embodiment, interface 246 can be coupled to core switch 236 via a bus such as an APB bus (not shown).

Interface 256C can be implemented as a 64-bit slave interface that couples programmable circuitry 204 directly with core complex 206 and, more particularly, SCU 218. Through interface 256C and SCU 218, circuits implemented within programmable circuitry 204 are provided with direct access to the L1 cache within each of cores 208 and 210, IRQ 216, L2 cache 220, and OCM 222. Accordingly, circuits within programmable circuitry 204 can read and/or write to such memories and detect interrupts generated or asserted within core complex 206. In addition, signal 290 can represent one or more interrupts from programmable circuitry 204 that can be provided to IRQ 216 as ports or signals and/or one or more copies of interrupts from PS 202, and in particular from core complex 206, that can be provided to programmable circuitry 204 as ports or signals. In another embodiment, interface 256C can provide coherent access to core complex 206 that would be suitable for use by circuits functioning as co-processors. For example, a soft processor implemented within programmable circuitry 204 can communicate with PS 202 via interface 256C.

Interface 256D can be implemented to provide a plurality, e.g., four, 64-bit slave interfaces. Interface 256D can be used to exchange large amounts of data between PS 202 and circuits implemented within programmable circuitry 204 efficiently. As shown, interface 256D provides circuits implemented within programmable circuitry 204 with access to OCM 222 via memory switch 238 and access to off-chip memory via memory switch 238 and memory controller 228.

PS 202 further includes a processor configuration access port (PCAP) 258. As shown, PCAP 258 can be coupled to a configuration controller 260 and a system monitor block (system monitor) 262 located within programmable circuitry 204.

In addition, PS 202 can include PS voltage detector 292. PS voltage detector 292 can monitor incoming voltage sources from a power supply depicted as signal 294. Responsive to determining that the voltage of signal 294 meets a predetermined voltage level, PS voltage detector 292 can enable one or more other components by issuing control signals (not shown). For example, responsive to determining that the voltage of signal 294 is at least a minimum voltage level, PS voltage detector 292 can enable one or more IOBs of IC 200. In another example, responsive to determining that the voltage of signal 294 meets a minimum voltage level, PS voltage detector 292 can enable one or more level shifters collectively shown as level shifting circuitry 296. Further functionality of PS voltage detector 292 will be described with reference to the remaining figures.

Level shifting circuitry 296, in general, helps to electrically isolate PS 202 from programmable circuitry 204. Level shifting circuitry 296 is configured to convert signals at a first voltage level to signals at a second voltage level. In some cases, the first and second voltage levels can be different voltage values. For example, in some cases, PS 202 can operate using a power signal having a different voltage potential than the power signal provided to programmable circuitry 204. In other cases, PS 202 can receive one or more power signals that have, or are intended to have, a same voltage potential as power signals provided to programmable circuitry 204. The power signals, however, can be independently controlled, resulting in two different power domains despite the similarity or sameness of the voltage potentials of the power signals. The independence of the power signals can cause small variations in the voltage potential of the power signals provided to PS 202 as compared to the power signals provided to programmable circuitry 204.

To account for the potential variations in the power signals and also to support the ability to power cycle programmable circuitry 204 independently of PS 202, signals crossing between PS 202 and programmable circuitry 204 can be passed through level shifting circuitry 296. Though illustrated as a single block, it should be appreciated that each of the various interfaces described, e.g., FMIO interface 252, trace interface 248B, interfaces 256A-256D, PCAP 258, and any other signals such as clock signals and DMA signals, can include, or pass through, level shifters represented by level shifting circuitry 296. Level shifting circuitry 296 ensures that voltage levels for signals that propagate between PS 202 and programmable circuitry 204 are matched.

IC 200 can include one or more different classes of level shifters within level shift circuitry 296. For example, a first class of level shifters can be configured to connect signals, e.g., system level signals such as configuration signals, boundary scan signals and/or functions, directly from PS 202 to components within programmable circuitry 204 such as system monitor 262 as described. Level shifters belonging to the first class of level shift circuitry can be enabled when the PS is out of reset, e.g., enters the operational mode, and the power to programmable circuitry 204 has been determined to be adequate for operation. Adequate power for operation of programmable circuitry 204 can include sufficient power for configuration of programmable circuitry 204 to occur and/or sufficient power for any circuits implemented within programmable circuitry 204 to function.

A second class of level shifters can be configured to connect test signals from programmable circuitry 204 to PS 202. The second class of level shifters can be enabled when PS 202 is out of reset and programmable circuitry 204 has both adequate power and is also configured to implement circuitry. When disabled, the second class of level shifter can be configured to output a default logic high.

A third class of level shifters can be configured or available to connect user signals between PS 202 and programmable circuitry 204. The third class of level shifter can be enabled when PS 202 is out of reset and programmable circuitry 204 has both adequate power and is configured. In an embodiment, the third class of level shifters, when disabled, can be configured to output a default logic low.

A fourth class of level shifter can be configured to convey one or more system level signals between programmable circuitry 204 and PS 202. The fourth class of level shifters can be configured to be enabled, e.g., operational, at all times.

Programmable circuitry 204 can be implemented to include one or more programmable circuit blocks that can be coupled together using programmable interconnect circuitry. The programmable circuit blocks and the programmable interconnect circuitry can be configured to implement one or more different physical circuits, e.g., user circuitry 280, based upon configuration data loaded into IC 200. It should be appreciated that programmable circuitry 204, with the exception of various hard-wired circuits implemented therein, is not operational or functional until configuration data is loaded within configuration memory causing physical circuitry to be implemented within programmable circuitry 204.

As shown, programmable circuitry 204 can include a configuration controller 260 and a system monitor 262. Configuration controller 260 and system monitor 262 can be coupled to PCAP 258 within PS 202. Configuration controller 260 and system monitor 262 can be implemented in the form of hard-wired circuitry. Configuration controller 260 is responsible for writing configuration data to configuration memory cells thereby physically implementing circuitry specified by the configuration data within programmable circuitry 204.

System monitor 262, which has a direct connection with PS 202 via PCAP 258 like configuration controller 260, can perform functions such as analog-to-digital (ND) conversion which can be leveraged to provide voltage monitoring, current monitoring, and/or temperature monitoring. System monitor 262 can include a plurality of inputs, e.g., 16. One or more inputs can be selectively configured for continuous monitoring of a signal. In general, system monitor 262 can provide 12-bit sampling of voltages between approximately zero and one volt at sampling rates of up to approximately 1 MHz. Through the sampling function, system monitor 262 can monitor voltage variation to detect events such as changes in current, variation in temperature, etc. For example, system monitor 262 can sample the forward voltage of a diode to yield a measure of temperature since forward voltage is temperature dependent. In general, higher voltages are indicative of lower temperatures.

The signals that can be monitored can include signals within IC 200 or signals provided to IC 200 from an external source. In an aspect, system monitor 262 can provide an alarm or notification function when a signal varies more than a predetermined amount. For example, an alarm or other indication signal can be provided to circuitry within programmable circuitry 204 when a particular condition is met, e.g., the value of the signal increases or decreases outside of a specified range. In another example, an interrupt can be generated by system monitor 262 that can be provided to PS 202, e.g., to IRQ 216. System monitor 262 further can be configured to stream sample data generated from A/D conversion, provide sample data periodically, or provide sample data when polled by circuitry within programmable circuitry 204 or by PS 202.

System monitor 262 can include one or more different types of interfaces. To perform ND conversions, system monitor can include one or more analog inputs that can be sampled. System monitor 262 can include a JTAG interface through which PS 202 can interact with system monitor 262. Using the JTAG interface, system monitor 262 can function as a peripheral of PS 202. System monitor 262 further can include one or more configurable signals that can be controlled by circuitry within programmable circuitry 204. For example, circuitry implemented within programmable circuitry 204 can control one or more signals of system monitor 262 to receive sampled values from system monitor 262. System monitor 262 further can include one or more signals through which reference voltages can be provided from external to IC 200.

In another embodiment, system monitor 262 can provide test functions for analog signals within IC 200. For example, one or more or all analog signals within PS 202 and/or programmable circuitry 204 can be selectively coupled to system monitor 262 when placed in a test mode. Accordingly, the analog signals can be monitored using system monitor 262 in this test mode. For example, analog signals such as those used in the bandgap circuitry of clock unit 226 can be coupled to system monitor 262 for testing when IC 200 is placed in the test mode.

In general, system monitor 262 provides highly accurate sampling capabilities to monitor quantities such as voltage, current, temperature, or the like within IC 200 as described. Unlike other voltage detectors to be described herein that are involved in the startup, or power on, process of IC 200, system monitor 262 is not functional until programmable circuitry 204 has been configured, e.g., a circuit design has been implemented therein through the loading of configuration data.

Programmable circuitry 204 also can be configured to implement one or more interfaces in the form of hard-wired circuits. For example, a JTAG interface 264, one or more MGTs 266A-266D, a Peripheral Component Interconnect Express (PCIe) interface 268, an Internal Configuration Access Port (ICAP) 270, and a security port 272 can be included as hard-wired circuits despite being located within the programmable circuitry portion of IC 200. The various interfaces described with reference to programmable circuitry 204 illustrate exemplary interfaces that can be implemented and are not intended to be restrictive or limiting as to the one or more embodiments disclosed within this specification.

For example, configuration data can be loaded into IC 200 and received by a configuration controller 260. In an embodiment, configuration data can be received through PS 202, which can control the configuration process of IC 200. Configuration controller 260, which can be implemented as a hard-wired circuit within programmable circuitry 204, can load the configuration data received from PS 202 via PCAP 258 within configuration memory (not shown) of IC 200. Different physical circuits such as user circuitry 280 can be implemented, or formed, within programmable circuitry 204 as specified by the particular configuration data loaded into configuration memory of IC 200. It should be appreciated that the loading of configuration data in this manner, due to the use of hard-wired circuitry, requires no initial configuration of programmable circuitry 204.

Circuits implemented within programmable circuitry 204 in consequence of the loading of configuration data, though physical circuits, typically are referred to as "soft" in that the circuitry is formed within the programmable circuitry rather than being hard-wired or otherwise fixed within IC 200. User circuitry 280 can be coupled to PS 202 through any of the various interfaces described. Direct access can be provided via interfaces 256, while further access to PS 202 can be facilitated through FMIO interface 252.

Figure 3:
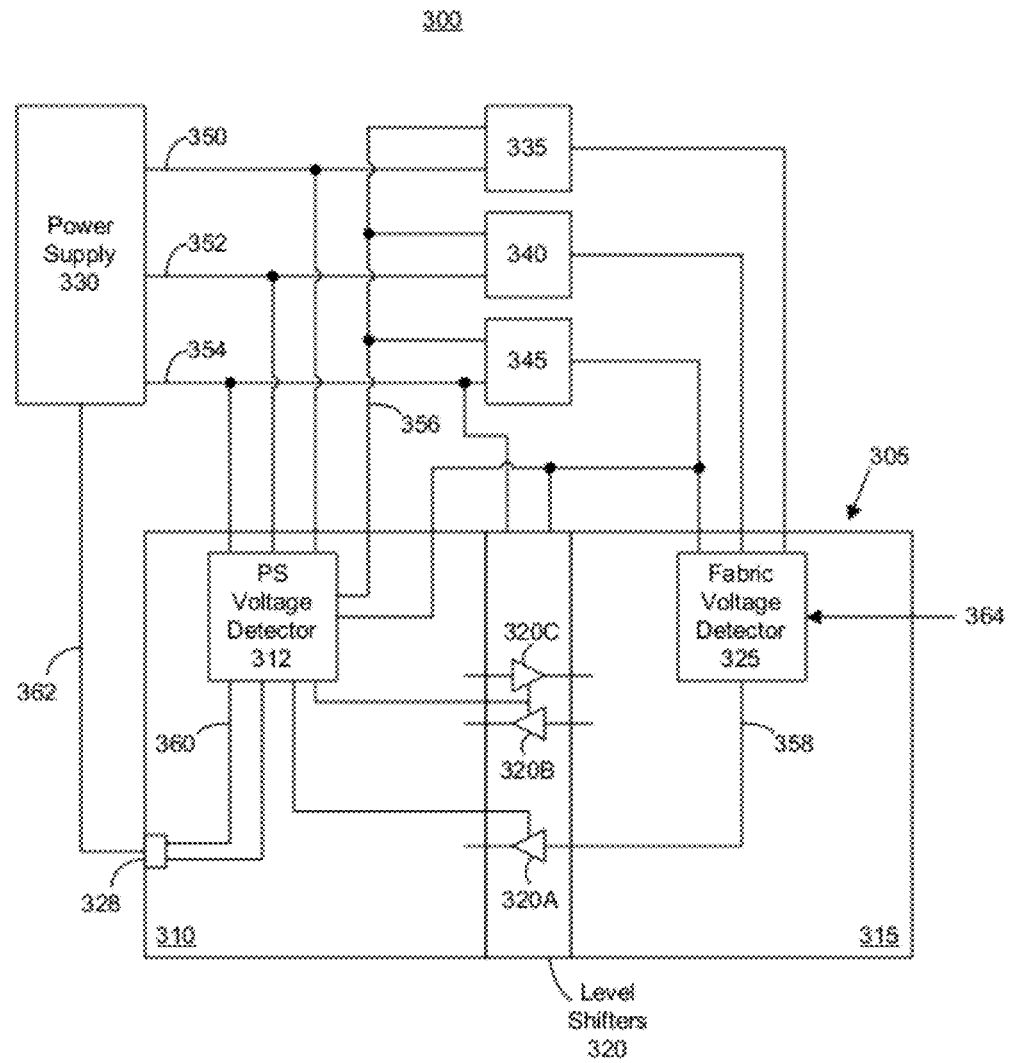
FIG. 3 is a third block diagram illustrating a system configured for power management in accordance with another embodiment disclosed within this specification.

FIG. 3 is a third block diagram illustrating a system 300 configured for power management in accordance with another embodiment disclosed within this specification. As shown, system 300 can include an IC 305, a power supply 330, and one or more switches shown as switches 335, 340, and 345. IC 305 can be implemented substantially as described with reference to the ICs depicted in FIGS. 1 and 2. FIG. 3, however, illustrates an abstracted view of IC 305 to more clearly illustrate power management functions. Accordingly, IC 305 can include a PS 310 and programmable circuitry 315. In an embodiment, programmable circuitry 315 can be implemented in the form of a programmable fabric or an FPGA. PS 310 and programmable circuitry 315 can be coupled together by one or more level shifters 320.

Power supply 330 can generate a plurality of power signals such as power signals 350, 352, and 354. In an embodiment, each of power signals 350-354 can have a different voltage potential. As shown, power signals 350-354 are coupled to a PS voltage detector 312 within PS 310 of IC 305.

Each of power signals 350-354 also can be coupled to one of switches 335-345, respectively. Switches 335-345 can be configured to selectively pass power signals 350-354 to fabric voltage detector 325 within programmable circuitry 315. Each of switches 335-345 can selectively pass power signals 350-354 to fabric voltage detector 325 responsive to a control signal 356 generated by PS 310. In an embodiment illustrated in FIG. 3, PS voltage detector 312 can generate control signal 356. When switches 335-345 are turned on, power signals 350-354 propagate to programmable circuitry 315. When turned off, switches 335-345 decouple power signals 350-354 from programmable circuitry 315.

PS voltage detector 312 can be configured to monitor power signals 350-354 and determine when each power signal 350-354 meets one or more different voltage thresholds to be described herein in further detail. As illustrated, PS voltage detector 312 is coupled to power signal 354 in two locations. PS voltage detector 354 can be coupled to power signal 354 at a location between power supply 330 and switch 345 and at a location between switch 345 and fabric voltage detector 325.

Power signal 350 can be implemented as a 1.2-1.8 volt power signal that can be used to provide power to I/Os of IC 305. Power signal 352 can be implemented as a 1.8 volt power signal that can be used to provide pre-driver voltages and bias voltages to IC 305. Power signal 354, for example, can be implemented as a 1 volt power signal that can be used to supply logic circuitry of IC 305. The examples and values described are for purpose of illustration and, as such, are not intended as limitations of the one or more embodiments disclosed within this specification.

Level shifters 320 can be implemented as described with reference to level shifting circuitry 296 of FIG. 2. As shown, level shifters 320 can be coupled to power signal 354 in two locations, e.g., prior to switch 345 and as output from switch 345. In general, each of switches 335-345 will have some resistance that causes a voltage drop so that the output from each respective switch will have a voltage that is less than the power signal provided as input to the switch. Thus, in cases where two power domains are intended to operate at the same voltages, fluctuations in voltage on the power signals provided to each power domain can occur due to resistance of switches 335-345 as well as one or more other factors. Level shifters 320 can account for these fluctuations in voltage in order to pass signals between the first power domain, i.e., PS 310, and the second power domain, i.e., programmable circuitry 315.

As shown, programmable circuitry 315 also can include a voltage detector illustrated as fabric voltage detector 325. Fabric voltage detector 325 can detect when each of signals 350-354 reaches a predetermined voltage level and, in response generate signal 358. Signal 358 can be provided to PS 310 via a level shifter 320A. Level shifter 320A, for example, can be implemented as the fourth class of level shifter. It should be appreciated that, while not shown, the power signals can be distributed throughout PS 310 from PS voltage detector 312 or from one or more other components. Similarly, power signals can be distributed throughout programmable circuitry 315 from fabric voltage detector 325 or one or more other components. In addition, fabric voltage detector 325 can be implemented as hard-wired circuitry along with one or more other system-level components of IC 300 despite being located within programmable circuitry 315.

In operation, IC 300 can be powered on. Power supply 330, for example, can begin supplying power to IC 300. PS 310 can aid in powering on programmable circuitry 315 and in configuration of programmable circuitry 315. Immediately upon supplying power to PS 310, PS voltage detector 312 can begin to monitor voltages on power signals 350-354. Responsive to determining that one or more or all of the voltages on power signals 350-354 meets a first, predetermined minimum voltage level, also referred to as the minimum IOB voltage, PS voltage detector 312 can enable an IOB 328 via control signal 360.

In general, when PS voltage detector 312 enables IOB 328, PS voltage detector 312 has determined that the voltage potential received via one or more or all of power signals 350-354 is sufficient to drive IOB 328, e.g., has met the minimum IOB voltage. For example, IOB 328 can be enabled by coupling an internal power signal to IOB 328. The minimum IOB voltage can be high enough for IOB 328 to operate, but need not be high enough to initiate startup or boot of PS 310. Accordingly, the minimum IOB voltage still can be lower than a preferred or legal voltage range for operation of PS 310 within an operational mode.

Once active, IOB 328 is able to receive a power indication signal 362. Power indication signal 362 can be provided by power supply 330 or another external source. Power indication signal 362, for example, can be set high when power supply 330 is stable and, thus, when power signals 350-354 are stable and within the range necessary for startup of PS 310 to begin. Accordingly, though PS 310 utilizes PS voltage detector 312 to enable IOB 328, PS 310 relies upon power indication signal 362 to indicate when power supply 330 is operational and stable.

Responsive to receiving power indication signal 362, e.g., the signal going high, PS 310 can begin a boot or startup process. The startup process is described in greater detail with reference to the remaining figures. In an embodiment, as part of the startup process, PS voltage detector 312 can turn on switches 335-345 via control signal 356, thereby coupling programmable circuitry 315 with power signals 350-354.

With switches 335-345 turned on, PS voltage detector 312 can monitor the voltage on power signal 354 as output from switch 345. When PS voltage detector 312 determines that the voltage on signal 354 meets a second, predetermined minimum voltage, referred to as the minimum level shifter voltage, PS voltage detector 312 can enable one or more of level shifters 320, e.g., level shifter 320A. The minimum level shifter voltage can be one that is sufficient for one or more selected devices within programmable circuitry 315 to operate, e.g., level shifter 320A.

In an embodiment, the minimum level shifter voltage can be one that is high enough for programmable circuits and/or one or more of level shifters 320, e.g., circuits implemented using complementary metal-oxide semiconductor (CMOS) devices, to function. The minimum level shifter voltage can be one that, while large enough for devices to function, still is lower than a preferred or legal voltage range necessary for operation of devices within programmable circuitry 315 to support, for example, configuration functions and programmable fabric 315 generally to be in an operational mode. The minimum IOB voltage can, but need not, be the same or equal to the minimum level shifter voltage.

Further, with switches 335-345 enabled, fabric voltage detector 325 can begin operation. Fabric voltage detector 325 can begin monitoring the voltage on each of power signals 350-354 to determine when the voltage on one or more or all of power signals 350-354 meets a third predetermined minimum voltage that is required for operation of programmable circuitry 315 referred to as the minimum programmable circuitry voltage.

Responsive to fabric voltage detector 325 determining that the voltage on one or more or all of power signals 350-354 meets the minimum programmable circuitry voltage, fabric voltage detector 325 can generate signal 358, e.g., a programmable circuitry power indication signal, to PS 310 indicating that programmable circuitry 315 is powered-on. For example, when one or more or all of power signals 350-354 meets the minimum programmable circuitry voltage, fabric voltage detector 325 can bring signal 358 high. The minimum programmable circuitry voltage is the minimum, legal voltage level required for programmable circuitry 315 to function properly, e.g., remain in the operational mode, and undergo configuration. The minimum programmable circuitry voltage is generally higher than the minimum IOB voltage and/or the minimum level shifter voltage. Generation of signal 358 in response to fabric voltage detector 325 determining that one or more or all of power signals 350-354 meet the minimum programmable circuitry voltage indicates that programmable circuitry 315 is ready for configuration, e.g., for configuration data to be loaded to implement physical circuitry therein.

In an embodiment, fabric voltage detector 325 can operate in one of two different modes. The particular mode in which fabric voltage detector 325 operates can be selected responsive to a control signal 364 received from an external source. Depending upon the state of control signal 364, fabric voltage detector 325 can operate in a first mode or a second mode.

In the first mode, fabric voltage detector 325 can wait a predetermined amount of time after determining that one or more or all power signals 350-354 meet the minimum programmable circuitry voltage before generating signal 358, e.g., bringing signal 358 high. The amount of time, for example, can be approximately 50 milliseconds, though other time periods also can be used. In the second mode, fabric voltage detector 325 can generate signal 358 immediately in response to determining that one or more or all of power signals 350-354 meets the minimum programmable circuitry voltage. Signal 358 indicates to PS 310 that programmable circuitry 315 is functional, e.g., is in an operational mode, and can be configured to implement one or more different circuits.

While FIG. 3 is described using switches and common power signals between PS 310 and programmable circuitry 315 to achieve independent power domains, similar results can be achieved in a variety of different ways. For example, two completely independent power supplies can be used. In that case, rather than providing a control signal to external switches, control signal 364 can be provided to the power supply providing power to programmable circuitry 315 to power programmable circuitry 315 on and/or off. In another example, switches can be included within IC 300. In that case, control signal 356 can be provided to the switches located within IC 300 to power programmable circuitry 315 on and/or off.

Figure 4:
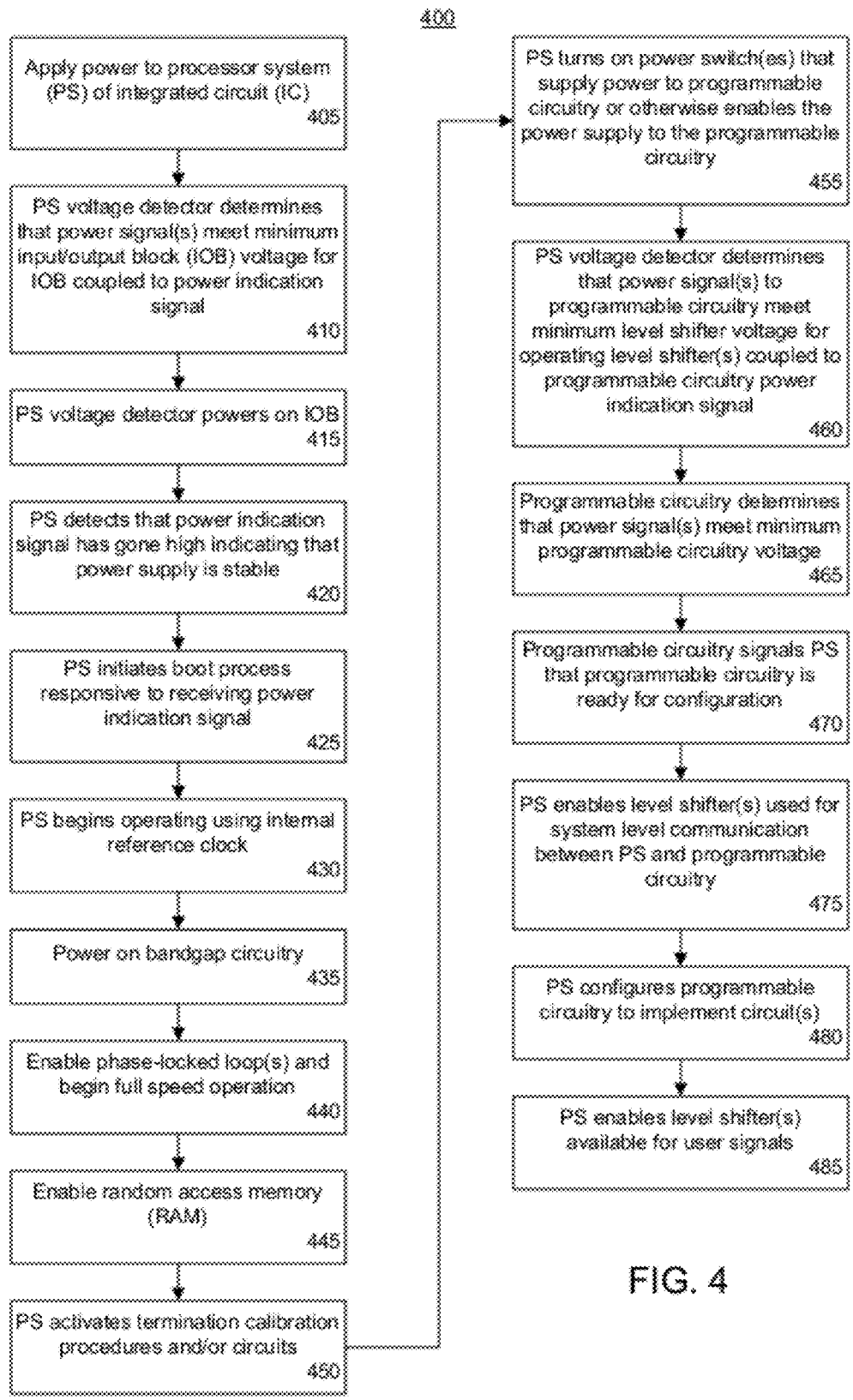
FIG. 4 is a first flow chart illustrating a method of power management for an IC in accordance with another embodiment disclosed within this specification.

FIG. 4 is a first flow chart illustrating a method 400 of power management for an IC in accordance with another embodiment disclosed within this specification. More particularly, method 400 illustrates an exemplary method of powering on an IC. Method 400 can be performed by an IC as described with reference to FIGS. 1-3 of this specification. Accordingly, in step 405, power can be applied or coupled to the PS of the IC. In step 410, the PS voltage detector can determine that the power signal(s) supplied to the PS meet the voltage requirements, e.g., the minimum IOB voltage, to operate the IOB that is coupled to an externally generated power indication signal. Accordingly, in response to determining that the power signal(s) meet the minimum IOB voltage, in step 415 the PS voltage detector can power on the IOB that is coupled to the power indicator signal. In an embodiment, the required voltage level for operation of the IOB can be less than the voltage level typically required for operation of the PS.

In step 420, the PS can detect that the power indication signal has gone high indicating that the power supply has reached a stable state. For example, the power indication signal can be held low by the power supply external to the IC until the stable state is achieved. Once the stable state is achieved, the power supply can bring the power indication signal high, indicating that the required voltage for operation of the PS is available from the power supply. The PS voltage detector can detect the state change in the power indication signal due to activation of the IOB in which the power indication signal is coupled in step 415.

In step 425, responsive to detecting the high state of the power indicator signal, the PS voltage detector can initiate a boot or startup process in the PS. Steps 430-450, in general, describe the startup process that can be performed by the PS. In step 430, the PS can begin operation using an internally generated reference clock. The internally generated reference clock, for example, can be generated by clock unit 226 of FIG. 2. In general, the internal reference clock operates at a frequency that is less than the frequency of the clock signal used to ultimately clock the PS during normal operation, e.g., the operational mode. For example, in an embodiment, the internal clock signal can have a frequency of approximately 30 MHz.

In step 435, the PS can enable, or power on, the bandgap circuitry. The bandgap circuitry, for example, can be located within the clock unit of the PS and, in general, provides a reference voltage for use by PLLs also located within the clock unit. Accordingly, in step 440, the PS can enable the PLLs and begin full speed operation. For example, when operating using the internally generated reference clock, the PLLs of the clock unit are bypassed. Upon enablement of the bandgap circuitry and the PLLs, the PLLs are no longer bypassed, thereby allowing the PS to operate at full speed according to an externally provided clock signal to which the PLLs of the clock unit can synchronize. As noted, the frequency of the clock signal output by the PLLs, once operational, can be significantly higher than the internally generated reference clock.

In step 445, the PS can enable RAM that is coupled to the PS via the memory controller. In step 450, the PS can activate any termination calibration procedures and/or circuits thereby synchronizing with the RAM. In general, after step 450, the PS can be considered to be in an operational mode. The PS, for example, can execute program code having exited the reset state. In another example, the PS can also begin to manage power for the programmable circuitry.

In step 455, the PS can begin managing power on procedures of the programmable circuit portion of the IC. For example, in step 455, the PS can turn on the switches that supply power to the programmable circuitry of the IC or otherwise enable the power supply to the programmable circuitry. For example, the PS can, via a control signal, instruct the switches to turn on, thereby allowing any power signals received by the switches to be output, and propagate to, the programmable circuitry.

In step 460, the PS voltage detector determines that power signal(s) to the programmable circuitry meet the minimum level shifter voltage for operating level shifter(s) coupled to the programmable circuitry power indication signal. In step 465, the programmable circuitry can determine that the power signal(s) meet the minimum programmable circuitry voltage. In step 470, responsive to determining that the power signal(s) meet the minimum programmable circuitry voltage, the programmable circuitry signals the PS that the programmable circuitry is ready for configuration. As noted, the programmable circuitry can communicate readiness for configuration through the programmable circuitry power indication signal that is coupled to one of the system level shifters that has been enabled by the PS.

In step 475, the PS can enable any level shifters used for communicating system level signals between the PS and the programmable circuitry. In an embodiment, the PS can enable level shifters that do not require configuration of the programmable circuitry. One or more level shifters that propagate clock signals passed between the PS and the programmable circuitry also can be enabled.

When disabled, each level shifter can be configured to output a constant value, e.g., either a low or a high. Once enabled, the output of the level shifter becomes dependent upon the input provided to the level shifter. In an embodiment, when the level shifter receives a logic high, the level shifter can output a logic high. when the level shifter receives a logic low, the level shifter can output a logic low. In another embodiment, the level shifter can be configured to output a complementary value. For example, when the level shifter receives a logic high as an input, the level shifter can output a logic low. Similarly, when the level shifter receives a logic low as an input signal, the level shifter can be configured to output a logic high. In any case, when disabled, the level shifter can be configured to output a constant logic high or a constant logic low.

In step 480, the PS can configure the programmable circuitry to implement one or more circuits. The PS can access configuration data stored off-chip. The PS can load the configuration data into the IC and communicate that configuration data to the configuration controller. The configuration controller can load the configuration data within configuration memory cells that, once loaded, implement one or more physical circuits within the programmable circuitry as specified by the configuration data.

In step 485, the PS can enable level shifter(s) that are available for passing user signals between the PS and the programmable circuitry. After step 485, the entire IC is operational. As noted, the PS is in an operation mode and is capable of executing program code. Further, the programmable circuitry is an operation mode. In an embodiment, the programmable circuitry can be released from a reset type of state subsequent to configuration through generation of a user specified signal. The user specified signal can be one that is generated by circuitry implemented within the programmable circuitry in consequence of the loading of configuration data as described with reference to step 480.

Figures 5, 6:
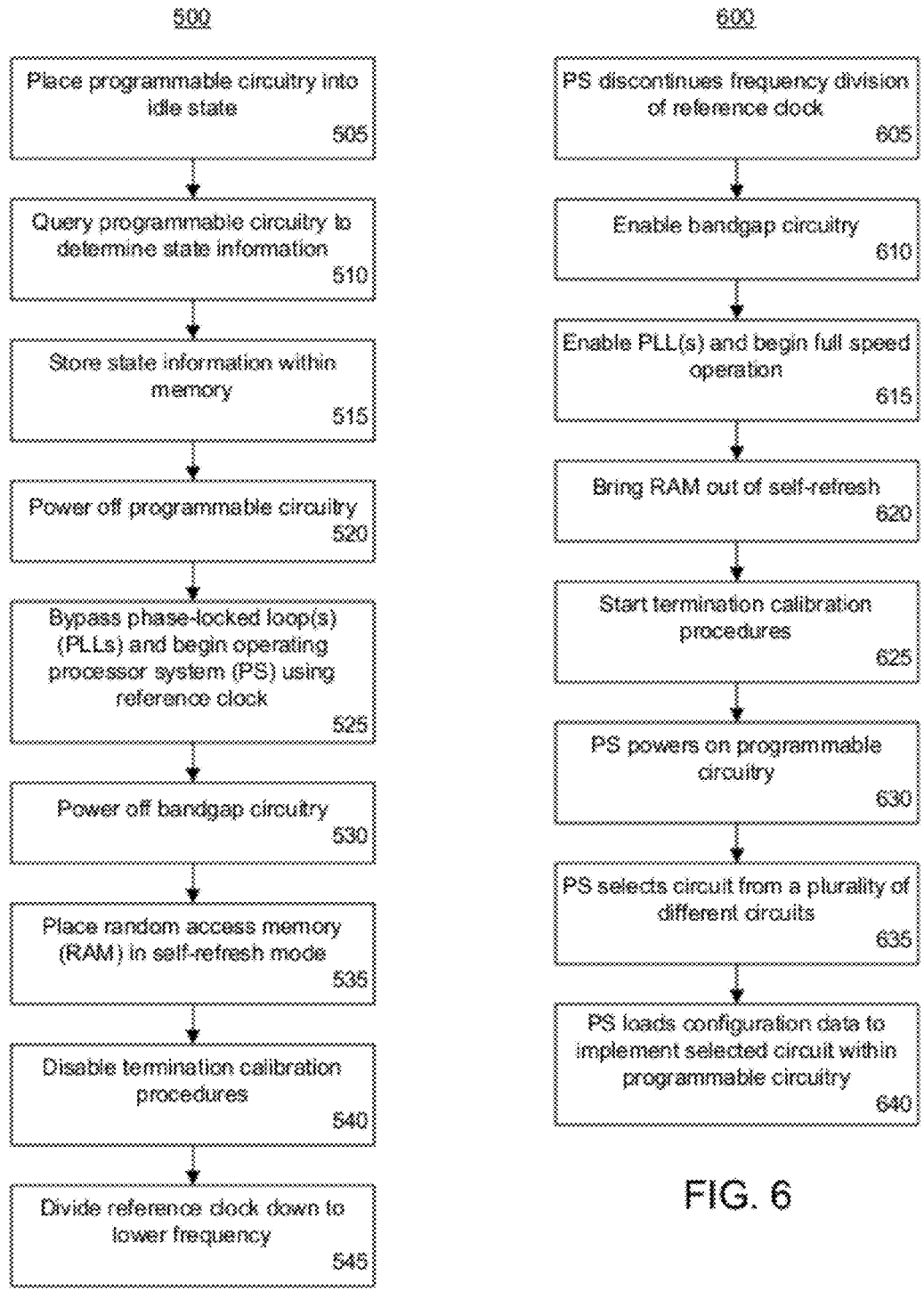
FIG. 5 is a second flow chart illustrating a method of power management for an IC in accordance with another embodiment disclosed within this specification.
FIG. 6 is a third flow chart illustrating a method of power management for an IC in accordance with another embodiment disclosed within this specification.

FIG. 5 is a second flow chart illustrating a method 500 of power management for an IC in accordance with another embodiment disclosed within this specification. More particularly, method 500 illustrates one technique for powering off the programmable circuitry of an IC configured as described with reference to FIGS. 1-4 of this specification. Method 500 illustrates how power management of the IC, including the programmable circuitry, can be performed by the PS. Method 500 can begin in a state where both the PS and the programmable circuitry are operational, e.g., in an operation mode. The PS can be executing program code and the circuitry implemented within the programmable circuitry can be operating. Responsive to some signal or event, the PS can determine that the programmable circuitry is to be powered off and, accordingly, can begin a power off procedure for the programmable circuitry.

Beginning in step 505, the PS can initiate a power off procedure within the programmable circuitry that allows state of circuitry implemented within the programmable circuitry to be stored and, at least in part, subsequently restored when the programmable circuitry is powered on again. The power off procedure, as it relates to the programmable circuitry, generally includes steps 505-520.

Accordingly, in step 505, the PS can place the programmable circuitry into an idle state. For example, the PS can place the programmable circuitry into a state in which any operations that are in progress or that have been provided to the programmable circuitry are allowed to complete, while preventing any further, or new, transactions from entering the programmable circuitry. When operations to the programmable circuitry have completed, for example, the PS can halt the programmable circuitry, e.g., gate various clock signals provided to the programmable circuitry and the like. Accordingly, the programmable circuitry is no longer in the operation mode.

In step 510, the PS can query the programmable circuitry to determine state information for the circuitry implemented within the programmable circuitry, e.g., for the user circuitry. In an embodiment, data stored within the programmable circuitry can be obtained by the PS using a configuration readback function, a boundary scan function, or the like. For example, data stored in one or more memories within the programmable circuitry can be obtained or read by the PS. Such data can include a table of coefficients, or other data needed by the circuitry implemented within the programmable circuitry. In another example, when a soft processor such as the MicroBlaze™, as is available from Xilinx, Inc. of San Jose, Calif., is implemented within the programmable circuitry, the values stored in registers as well as the contents of program memory of the soft processor within the programmable circuitry can be obtained.

In step 515, the PS can store the state information obtained from the programmable circuitry in memory. In an embodiment, the PS can store the state information within a memory that is located off-chip. For example, the PS can store the state information within an external RAM. In another embodiment, the PS can store the state information within an internal memory. For example, the PS can store the state information within the OCM described with reference to FIG. 2, which is located within the PS.

In step 520, the PS can power off the programmable circuitry. For example, the PS, via a control signal, can instruct the switches to decouple the programmable circuitry from the power signals. Once the programmable circuitry is powered off, the PS can continue to operate and execute program code in a normal operating state. Alternatively, subsequent to powering off the programmable circuitry, the PS optionally can be placed into a low power mode. While in low power mode, the PS does not execute program code and consumes significantly less power than when in the operational mode where the system clocks, for example, are operating at full speed.

Accordingly, steps 525-545 can be optional in nature and illustrate steps for placing the PS in the low power, e.g., sleep, mode. In an embodiment, for example, the PS can be configured to initiate low power mode responsive to powering off the programmable circuitry. In another embodiment, the PS can be instructed to enter low power mode responsive to a signal or interrupt received from external to the IC.

In step 525, the PS can bypass the PLL(s) operating within the clock unit. When the PLL(s) are bypassed, the PS can begin operating using the internally generated reference clock. In step 530, the PS can power off the bandgap circuitry. In step 535, the PS can place the RAM in a self-refresh mode. In step 540, the PS can disable termination calibration functions for the RAM. In step 545, the reference clock can be frequency divided to further reduce power consumption within the PS. For example, the internally generated clock, having a frequency of approximately 30 MHz, can be frequency divided down to approximately 1 MHz.

FIG. 6 is a third flow chart illustrating a method 600 of power management for an IC in accordance with another embodiment disclosed within this specification. More particularly, method 600 illustrates an exemplary method of bringing an IC out of a low power mode. Method 600 can be implemented by an IC as described with reference to FIGS. 1-5 of this specification. In general, method 600 illustrates one technique for bringing the PS out of a low power mode to perform reconfiguration of the programmable circuitry.

In step 605, the PS can discontinue frequency division of the internally generated reference clock. The PS can enable the bandgap circuitry in step 610 and, in step 615, enable the PLL(s). Once enabled, the PLLs are no longer bypassed and the PS can begin operating at full speed, e.g., the frequency of the clock signal(s) output by the PLL(s) of the clock unit. In step 620, the PS can bring the RAM out of self-refresh mode. In step 625, the PS can initiate or start termination calibration procedures.

In step 630, the PS can power on the programmable circuitry. For example, the PS can turn on the switches via the control signal to couple the programmable circuitry to the power signals. In an embodiment, the PS can awake from the low power mode responsive to a signal or interrupt that requests configuration of the programmable circuitry. For example, the signal can request implementation of completely new circuitry within the programmable circuitry or implementation of partially new circuitry where at last some circuitry can continue to operate uninterrupted while the newly specified circuitry is implemented. The signal that awakens the PS from the low power mode can specify a particular circuit to be implemented within the programmable circuitry, can specify performance profile parameters, or the like. For example, the PS can awaken from the low power or sleep mode to perform or initiate reconfiguration, dynamic reconfiguration, or partial dynamic reconfiguration, of the programmable circuitry.

In step 635, the PS can select a circuit from a plurality of different circuits for implementation within the programmable circuitry. For example, one or more circuit designs can be stored in the form of configuration data within a memory external to the IC. The PS can access the external memory, e.g., a flash memory or a RAM. Each of the plurality of circuit designs further can be associated with a performance profile. The performance profile for each circuit can be stored in memory within the PS, e.g., within the program code that is executed by the PS, within the external memory with the configuration data, or another memory.

In an embodiment, each of the plurality of circuits, as specified by the configuration data, can be functionally equivalent. The circuits, however, can consume different amounts of power and, thus, generally exhibit different performance characteristics in terms of the amount of time each circuit requires to perform the same task or function. The time information and the power consumption information of each circuit can be specified as part of the performance profile of each circuit.

In any case, the PS can be programmed to select one of the plurality of circuits according to one or more attributes within the performance profile. In one example, the PS can receive a signal from a source external to the IC that specifies a particular desired performance requirement. The performance requirement can specify timing, power consumption, or a combination of both. The PS can select a circuit that most closely matches the specified performance characteristics.

In another example, the PS can select a particular circuit according to the operating state that exists within the PS at the time that reconfiguration of the programmable circuitry is to be performed. The particular manner in which the PS can select a circuit is not intended to be limited by the different examples provided.

In step 640, the PS can load the configuration data corresponding to the selected circuit. Loading the configuration data for the selected circuit causes that circuit to be physically implemented within the programmable circuitry. For example, the PS can read the configuration data from the external memory and provide the configuration data to the configuration controller within the programmable circuitry. The configuration controller can write the received configuration data to the appropriate configuration memory cells, thereby physically implementing the circuit design within the programmable circuitry.

Though FIG. 6 illustrates an example in which the PS reconfigures at least a portion of the programmable circuitry to implement a different circuit than was implemented in the programmable circuitry prior to power off, in another embodiment, PS can power on the programmable circuitry. Once powered on, the PS need not perform reconfiguration of the programmable circuitry. Instead, the circuitry previously implemented within the programmable circuitry can remain intact. The PS then can load the stored state information for the circuit from memory back into the relevant memories and/or registers within the programmable circuitry to at least partially restore the operating state of the circuitry prior to powering down the programmable circuitry. Once the state is restored, or partially restored, the programmable circuitry can exit the reset state and function in the operational mode.

The flowcharts in the figures illustrate the architecture, functionality, and operation of possible implementations of systems, methods and computer program products according to one or more embodiments disclosed within this specification. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a non-transitory data storage medium, e.g., a computer-usable or computer-readable medium, storing program code that, when loaded and executed in a system comprising memory and a processor, causes the system to perform at least a portion of the functions described within this specification. Examples of non-transitory data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of regulating power consumption within an integrated circuit comprising programmable circuitry and a processor system coupled to the programmable circuitry, the method comprising:
placing the processor system and the programmable circuitry of the integrated circuit in an operational mode;
initiating a power off procedure within the programmable circuitry under control of the processor system while the processor system remains in the operational mode;
powering on the programmable circuitry under control of the processor system; and
configuring at least a portion of the programmable circuitry with one of a plurality of circuits selected according to power profiles of the plurality of circuits, wherein each of the plurality of circuits is functionally equivalent and has a different power profile.

2. The method of claim 1, further comprising:
decoupling power from the programmable circuitry under control of the processor system responsive to determining that the power off procedure of the programmable circuitry is complete.

3. The method of claim 1, further comprising:
determining state information for circuitry implemented within the programmable circuitry prior to powering off the programmable circuitry; and
storing the state information within a memory.

4. The method of claim 3, further comprising:
storing the state information within a memory within the processor system.

5. The method of claim 3, further comprising:
powering on the programmable circuitry under control of the processor system.

6. The method of claim 5, further comprising:
restoring the state information within circuitry implemented within the programmable circuitry.

7. The method of claim 1, further comprising:
powering on the programmable circuitry under control of the processor system, wherein the programmable circuitry comprises a first circuit; and
configuring at least a portion of the programmable circuitry to implement a second circuit within the programmable circuitry.

8. An integrated circuit comprising:
a processor system configured to execute program code, wherein the processor system is hard-wired; and
a programmable circuitry configurable to implement different physical circuits, wherein the programmable circuitry is coupled to the processor system and is configured to be powered off independently of the processor system;
wherein the programmable circuitry is powered on and off under control of the processor system;
wherein the programmable circuitry implements one of the different physical circuits selected according to power profiles of the different physical circuits, wherein each of the different physical circuits is functionally equivalent and has a different power profile.

9. The integrated circuit of claim 8, further comprising:
a system monitor configured to perform analog-to-digital conversions, wherein the system monitor is directly coupled to the processor system.

10. The integrated circuit of claim 8, wherein responsive to determining that the programmable circuitry has completed the power off procedure, the processor system signals a power supply switch to decouple power from the programmable circuitry.

11. The integrated circuit of claim 8, wherein the processor system is configured to determine an operating state for circuitry implemented within the programmable circuitry prior to powering-off the programmable circuitry and to store state information specifying the operating state of the programmable circuitry within a memory.

12. The integrated circuit of claim 11, wherein the processor system comprises:
a core; and
an internal memory,
wherein the core is configured to store the state information within the internal memory of the processor system.

13. The integrated circuit of claim 11, wherein the processor system is configured to power on the programmable circuitry and restore the operating state of the programmable circuitry according to the stored state information.

14. The integrated circuit of claim 8, further comprising:
a first level shifter configured to pass a system level signal between the processor system and the programmable circuitry; and
a second level shifter configured to pass a user signal between the processor system and the programmable circuitry,
wherein the first level shifter and the second level shifter are independently activatable.

15. The integrated circuit of claim 8, wherein the processor system is configured to awake from a low power mode responsive to a request to configure at least a portion of the programmable circuitry.

16. The integrated circuit of claim 8, wherein the programmable circuitry comprises:
level detection circuitry configured to detect that a voltage level of a power supply provided to the programmable circuitry has reached a predetermined voltage level necessary for operation of the programmable circuitry,
wherein the level detection circuitry is configurable to operate in a first mode that signals the processor system immediately responsive to detecting the voltage level of the power supply has reached the predetermined voltage level or a second mode that signals the processor system immediately responsive to expiration of a predetermined amount of time after the voltage level of the power supply has reached the predetermined voltage level.

17. An integrated circuit comprising:
a processor system configured to execute program code, wherein the processor system is hard-wired; and
a programmable circuitry configurable to implement different physical circuits, wherein the programmable circuitry is coupled to the processor system and is configured to implement a power off procedure under the control of the processor system,
wherein the processor system is configured to select a circuit from a plurality of functionally equivalent circuits according to a performance profile of each of the plurality of functionally equivalent circuits and initiate configuration of the programmable circuitry to implement the selected circuit within the programmable circuitry,
wherein the performance profile of each of the plurality of circuits comprises power consumption information, wherein the processor system selects the circuit having a performance profile corresponding to a power consumption requirement.

* * * * *